United States Patent [19]
Shepherd

[11] 3,816,759
[45] June 11, 1974

[54] DIVIDER CIRCUITS

[75] Inventor: Brian Shepherd, Witney, England
[73] Assignee: Smiths Industries Limited, London, England

[22] Filed: May 12, 1972
[21] Appl. No.: 253,034

[30] Foreign Application Priority Data
May 17, 1971 Great Britain .................... 15345/71

[52] U.S. Cl. ......... 307/225 B, 307/252 K, 307/288, 307/303, 307/305
[51] Int. Cl. ...................... H03k 23/22, H03k 23/30
[58] Field of Search ........ 307/223 B, 225 B, 252 M, 307/289, 305, 302, 288, 303, 252 K; 328/48, 52.5

[56] References Cited

UNITED STATES PATENTS

| | | | |
|---|---|---|---|
| 3,064,890 | 11/1962 | Butler | 328/48 X |
| 3,070,713 | 12/1962 | Leightner | 307/289 X |
| 3,178,590 | 4/1965 | Heilweil et al. | 307/289 X |
| 3,348,070 | 10/1967 | Arnold | 307/252 M X |
| 3,373,297 | 3/1968 | Yates | 307/252 M |
| 3,509,366 | 4/1970 | Howe et al. | 307/289 X |

OTHER PUBLICATIONS

GE Application Note 200.19, 3/62 "Using SCR's"

*Primary Examiner*—John S. Heyman
*Attorney, Agent, or Firm*—Elliott I. Pollock

[57] ABSTRACT

A divide-by-two divider circuit comprises first, second and third switch means each having a pair of regeneratively interconnected transistors. The first and second switch means are arranged to switch from a non-conductive state to a conducting state in response to, respectively, the application of, and the cessation of, a first of two successive input signals. The third switch means responds to the application of the second signal to switch from a non-conducting state to a conducting state and to initiate switching of the first and second switch means back to the non-conducting state, and the third switch means reverts to its non-conducting state in response to the cessation of said second signal.

10 Claims, 4 Drawing Figures

DIVIDER CIRCUITS

BACKGROUND OF THE INVENTION

This invention relates to divider circuits and in particular to divide-by-two circuits.

Divide-by-two circuits of the prior art have usually necessitated a large number of discrete components (or, when comprising integrated circuits, a large area of semiconductor material) and often have required the use of one or more capacitors. Particularly where the divide-by-two circuit is additionally suitable for use as one stage of a multiple division circuit, the number of components (or area of semiconductor material) is of substantial significance and accordingly it is an object of the present invention to provide a divide-by-two circuit capable of production in a compact form and without the need for capacitors.

SUMMARY OF THE INVENTION

According to the present invention there is provided a divide-by-two circuit comprising first, second and third switch means. The first switch means is arranged to respond to the application to the circuit of a first of two successive input signals to switch from a first to a second operative state. The second switch means is arranged to respond to the cessation of said first signal to switch from a first to a second operative state. The third switch means is arranged to respond to the application of the second input signal to switch from a first to a second operative state and thereupon to initiate switching of the first and second switch means back to their first operative states, and is arranged to switch back to its first operative state in response to the cessation of said second signal.

Preferably each said switch means comprises a first transistor of one conductivity type and a second transistor of opposite conductivity type interconnected to form a regenerative switch.

BRIEF DESCRIPTION OF THE DRAWINGS

One form of divide-by-two circuit in accordance with the present invention will now be described, by way of example, with reference to the accompanying drawings in which.

DESCRIPTION OF THE PREFERRED EMBODIMENTS

Figures 1, 2, 4:
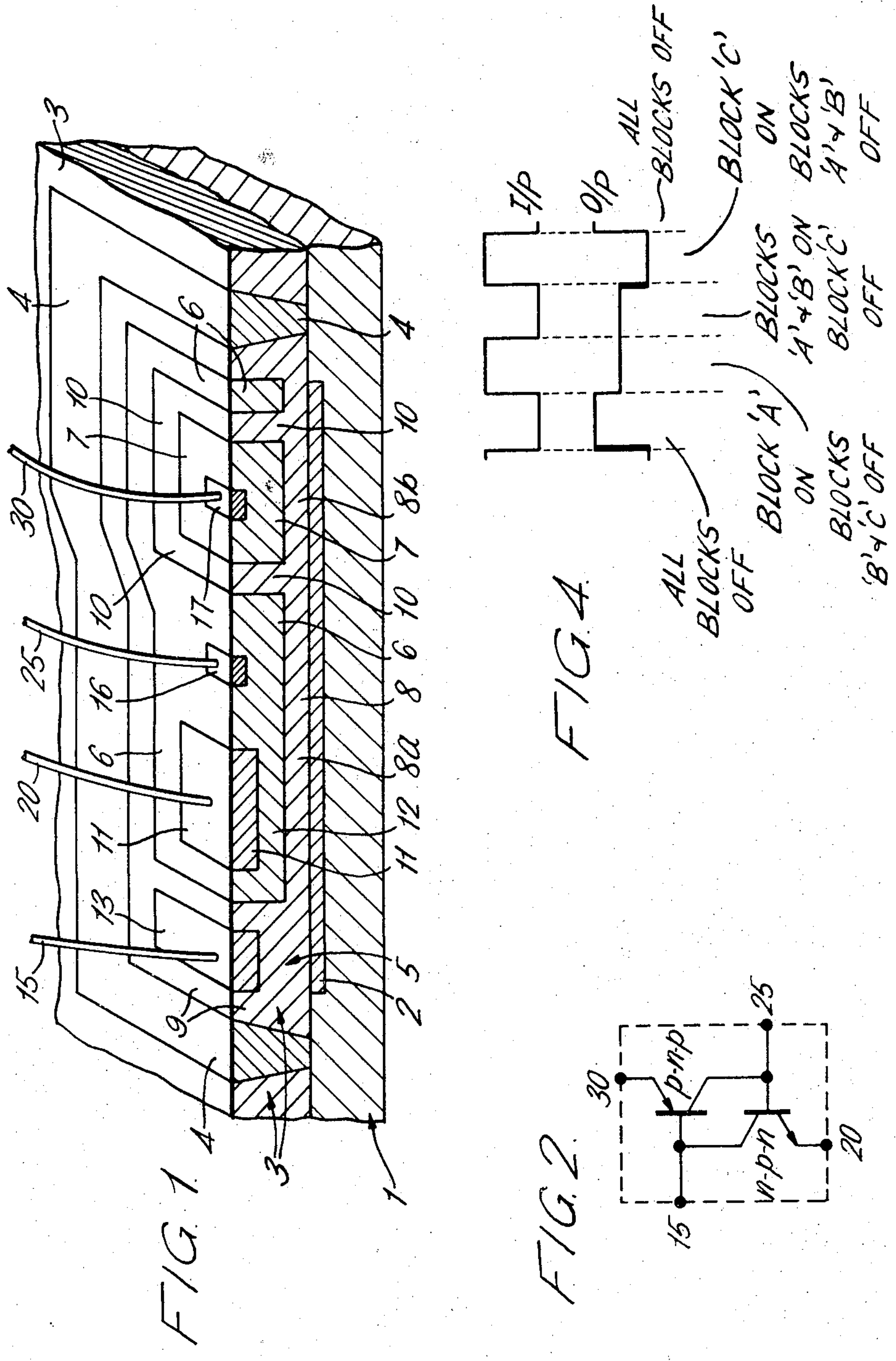
FIG. 1 is a perspective view of a center line sectioned semiconductor device comprising two transistors of opposite conductivity-type interconnected to form a regenerative switch.
FIG. 2 is a circuit diagram of the device of FIG. 1 showing the interconnection of the transistors.
FIG. 4 is a waveform diagram of input and output signals from the circuit of FIG. 3.

As shown in FIG. 1, a substrate 1 of p-type silicon is provided on its upper surface with a layer 2 of heavily doped n-type material and with an epitaxial layer 3 of n-type material. A generally keyhole-shaped isolation region 4 of p-type material is provided through the layer 3 spacially surrounding the edges of layer 2. The portion of layer 3 within the isolation region 4 comprises a body 5 of n-type material in contact with the layer 2. Within this body 5 two discrete portions 6 and 7 of p-type material are provided such that portion 6 wholly surrounds spacially the portion 7. The arrangement is such that the body 5 comprises: firstly a lowermost layer 8, and two parts 8*a* and 8*b* which contact the underside of portions 6 and 7 respectively; secondly an outermost, somewhat tubular, upstanding region 9 of generally keyhole-shaped cross-section surrounding and in contact with the portion 6 (and in contact with the isolation region 4); and thirdly an inner, somewhat tubular, upstanding region 10 of generally square cross-section surrounding the portion 7 in contact therewith and in contact with the portion 6. In an alternative arrangement, the tubular region 10 may be of annular cross-section surrounding a circular portion 7 in contact therewith and in contact with a circularly "apertured" portion 6. A layer 11 of heavily doped n-type material is provided within the portion 6 to be wholly surrounded thereby and in contact therewith and be spaced from the layer 8 of body 5 by a layer part 12 of portion 6.

A layer 13 of heavily doped n-type material is also provided in the region 9, conveniently at the narrower end of the device, so as to be wholly surrounded by the region 9 and in contact therewith. Two discrete small portions 16 and 17 of heavily doped p-type material are provided respectively in portions 6 and 7 to be each surrounded by and in contact with its associated portion. Four electrical terminals 15, 20, 25 and 30 are affixed respectively to the layer 13, the layer 11, the portion 16 and the portion 17; the portions 16 and 17 being optionally provided solely to effect low ohmic contact of terminals 25 and 30 to portions 6 and 7.

The various materials employed, and the methods (such as the diffusion process) of providing them in the relative dispositions described above, may be those commonly utilized in the production of monolithic planar integrated circuits as will be appreciated by one skilled in the art.

It will be apparent that the above-described semiconductor device in planar integrated circuit form may be used as a bipolar "building block" for electronic circuits. The circuit of this building block (as shown in FIG. 2) is substantially that of a two-transistor regenerative switch in which an n-p-n transistor is coupled to a p-n-p transistor providing high loop gain. The emitter, base and collector of the n-p-n transistor are constituted by respectively the layer 11, the layer part 12 of portion 6, and the layer part 8*a* of body 5. These are connectable in an external circuit by the terminals 20, 25 and 15 respectively. The emitter, base and collector of the p-n-p transistor are constituted by respectively the portion 7, the tubular region 10 of body 5, and the portion 6. These are connectable in an external circuit by the terminals 30, 15 and 25 respectively. It will be appreciated that the terminal 15 is common to the collector of the n-p-n transistor and the base of the p-n-p transistor since the layer 8 and the tubular region 10 are integral with one another. The layer 2 provides a low resistance path between the terminal 15, both the parts 8*a* and 8*b* of layer 8 and the tubular region 10. Similarly, it will be appreciated that the terminal 25 is common to the base of the n-p-n transistor and the collector of the p-n-p transistor.

Regarding the two transistors as separate entities, however, the p-n-p transistor may be considered as providing a generally horizontal majority carrier path from the portion 7 to the portion 6 in all directions across the tubular region 10; while the n-p-n transistor may be considered as providing a generally vertical majority carrier path from the layer part 8*a* of body 5 to the layer 11 across the layer part 12 of portion 6.

In use, with the voltage at terminal 30 more positive than the voltage at terminal 20 (see FIG. 2), an appropriate intermediate voltage applied to either one of terminals 15 and 25 will cause both transistors to conduct (unless the voltages at the other terminals are such that one of the transistors remains reverse biassed, i.e. has its base-emitter junction insufficiently forward biassed). When the transistors conduct, they do so rapidly in a regenerative manner due to the high gain of the n-p-n transistor and of the p-n-p transistor resulting from the base-enclosed emitter and collector-enclosed base of the p-n-p transistor. The consequent high loop gain ensures that the building block remains hard ON even after removal of the base-applied intermediate voltage that switched it ON, and the block will only be switched OFF subsequently if the current drawn out of terminal 25 or passed into terminal 15 exceeds a predetermined proportion of the current flow through the block and out of terminal 20, this limiting proportion being dependent upon the relative gains of the two transistors. For example, the limiting value would be exceeded if the voltage difference between terminals 15 and 30 and/or between terminals 20 and 25 is (or are) altered to such an extent that either or both of the transistors is (or are) reverse biassed.

Although the above-described building block comprises two transistors, the particular configuration of their respective end masses (that is: emitters and collectors) and their respective intermediate masses (that is: bases) results in a substrate area requirement of no more than approximately 30 percent above that normally required for a typical single n-p-n transistor. Therefore, this building block is considered eminently suitable for the construction of various electronic circuits, as exemplified below, although clearly such circuits can be constructed from discrete components or from integrated circuit building blocks other than that described above.

Figure 3:
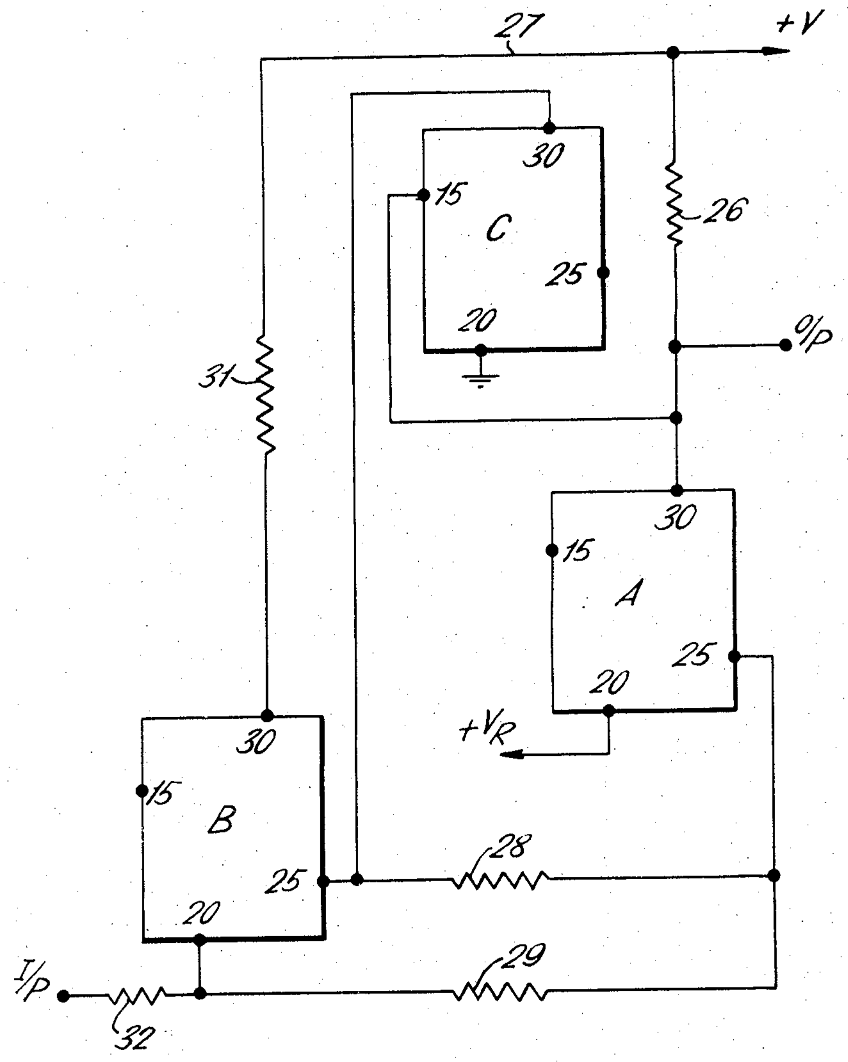
FIG. 3 is a circuit diagram of a divide-by-two circuit according to the present invention and utilizing three regenerative switches each identical to that of FIG. 2.

In the divide-by-two circuit of FIG. 3, three blocks A,B and C are provided each of which is identical to the block described above with reference to FIGS. 1 and 2. The terminals of each of these blocks will be hereinafter referred to by the reference letter of the particular block followed by the reference numerals indicated in FIGS. 1 and 2.

As is apparent from FIG. 3, the terminals A15, B15 and C25 are free and not connected in the circuit. Terminal A20 is connected to a reference voltage $V_R$, for example of + 2 volts with respect to ground. Terminal A30 is connected via a 20 kilohm resistor 26 to a line 27 maintained at a positive voltage of say 6 volts with respect to ground. Terminal A25 is connected via two 10 kilohm resistors 28 and 29 to the terminals B25 and B20 respectively. Terminal B30 is connected via a 14 kilohm resistor 31 to the line 27, and terminal B25 is connected to terminal C30. Terminal C20 is connected to ground, and terminal C15 is connected to terminal A30. In use an electrical input signal of pulse-waveform, preferably of square-wave pulses, is applied to the terminal B20 via a 10 kilohm resistor 32, and for every two cycles of the input pulse-waveform signal an output signal of pulse-waveform is obtained at the terminal A30.

The manner of operation of the circuit of FIG. 3 will now be described. Initially, before the application of the input signal's sequence of pulses, each of the three blocks A, B and C is in its OFF state, that is, is not passing a conduction current from its terminal 30 to its terminal 20. As the first pulse of the sequence rises positively in voltage, it raises the voltage at terminal A25 until it reaches a value sufficiently above the positive reference voltage $V_R$ of two volts for the n-p-n transistor of block A to be forward biassed and therefore conduct. This immediately causes block A to switch ON hard and the conduction current between terminals A30 and A20 thereby causes the voltage at terminal A30 to fall from the 6 volts on line 27 to approximately three volts (the voltage drop across block A being approximately one volt). Because the input point I/P is now positive with respect to terminal A25, terminal B20 is positive with respect to terminal B25 whereby the n-p-n transistor of block B is reverse biassed and block B thus remains OFF. Also, the voltage at terminal C15 (connected to terminal A30) is above that at terminal C30 (connected to terminal B25) so that the p-n-p transistor of block C is reverse biassed and block C thus remains OFF too.

As the first input pulse falls negatively the voltage at terminal B20 falls below that at terminal B25 until the n-p-n transistor of block B is forward biassed and the block B thus switches ON. Because of the high resistance provided by resistors 29 and 32 between the input point I/P and the terminal A25, the current flow out of block A via terminal A25 is very small and overcompensated for by the regenerative effect of the transistors of block A so that block A continues to conduct (i.e. it remains ON). The voltage at terminal C15 thus remains above that at terminal C30 so that block C still remains OFF.

As the second input pulse of the sequence rises positively, the voltage at each of the terminals B20, B25, and B30 rises proportionally until terminal C30 (connected to terminal B25) reaches a voltage sufficiently above the voltage (of approximately three volts) at terminal C15 (connected to the terminal A30) for the p-n-p transistor of block C to become forward biased. Block C thereby switches ON to pass a conduction current from its terminal C30 to its grounded terminal C20. Effectively terminal A30 connected to terminal C15 is thereby connected to ground via the n-p-n transistor of block C and thus the p-n-p transistor of block A is now no longer forward biassed so that block A switches OFF. Also, with block C conducting to ground (i.e. in its ON state) the voltage at terminal B25 connected to terminal C30 falls to approximately one volt (the voltage drop across block C being approximately one volt) so that, since the voltage at terminal B20 is positive due to the positive part of the second input pulse, the n-p-n transistor of block B is reverse biassed whereby block B switches OFF too.

As the second input pulse of the sequence falls negatively, the voltage at terminal C30 falls towards ground until the p-n-p transistor of block C is no longer forward biassed so that block C is switched OFF. This allows the voltage at terminal A30 to rise back up towards the supply voltage on line 27 and thereby provide an output signal O/P.

Thus one output signal of pulse-waveform is provided for two cycles of the pulse-waveform input signal and the blocks A, B and C simultaneously attain their initial all-OFF condition in readiness for the next sequence of two pulses or cycles of the input signal. FIG. 4 illustrates the input and output signal waveforms and it will be apparent that the circuit of FIG. 3 can form one stage of several, directly-connected, identical stages to obtain higher division ratios in a binary manner. To this end, the output of one stage (i.e. terminal A30) would be directly connected to the input point I/P of the next stage; and FIG. 4 shows the leading and trailing edges of the first input pulse (or cycle) to this next stage by respectively the left-hand and right-hand thicker vertical lines.

It will be appreciated that the whole divide-by-two circuit of FIG. 3 (or the whole of a higher order divider circuit formed by multiple stages each according to FIG. 3) can be formed as a planar integrated circuit, the resistors 26, 28, 29, 31 and 32 being integrally formed as so-called pinch or sandwich resistors. Although the particular resistance values of such resistors might fluctuate, this has been found to be of no great consequence as long as the ratio of one to the other is substantially in accordance with the ratio readily calculated from the above-specified resistance values. It is considered that these ratios can themselves vary by up to approximately 15 percent without detriment to the accurate functioning of the circuit of FIG. 3. Furthermore it will be appreciated that such a planar integrated divider circuit can be produced within a very small substrate area.

I claim:

1. A divide-by-two circuit comprising first, second and third switch means, each said switch means comprising a first transistor of one conductivity-type and a second transistor of the opposite conductivity-type interconnected to form a regenerative switch and having respective emitter, base and collector electrodes, a first terminal connected to the emitter electrode of the first transistor, a second terminal connected to both the base electrode of the first transistor and the collector electrode of the second transistor, a third terminal connected to the emitter electrode of the second transistor, and a fourth terminal connected to both the base electrode of the second transistor and the collector electrode of the first transistor, the second terminal of the first switch means being connected through respective resistive paths to the first and second terminals of the second switch means, the third terminal of the first switch means being directly connected to the fourth terminal of the third switch means, the second terminal of the second switch means being directly connected to the third terminal of the third switch means, the third terminals of the first and second switch means being connected through respective resistive paths to a supply line having a voltage thereon of predetermined polarity, the first terminal of the first switch means being connected to a reference voltage which is of the same polarity as, and of substantially smaller magnitude than, the said voltage, and the first terminal of the third switch means being connected to ground, whereby the first switch means is responsive to the application to the first terminal of the second switch means of a first of two successive input signals to switch from a non-conducting to a conducting state, the second switch means being responsive to the cessation of said first signal to switch from a non-conducting to a conducting state, the third switch means being responsive to the application of the second input signal to switch from a non-conducting to a conducting state and thereupon to initiate switching of the first and second switch means back to their non-conducting states, and the third switch means being operative to switch back to its non-conducting state in response to the cessation of said second signal.

2. A divider circuit according to claim 1, wherein the said resistive paths between the second terminal of the first switch means and the first and second terminals of the second switch means have substantially equal values of resistance.

3. A divide-by-two circuit comprising first and second voltage supply lines to be connected to an electric supply;

a third voltage supply line which is to have applied thereto a voltage intermediate the voltage on said first and second voltage supply lines;

first, second and third switch means, each said switch means having first and second operative states, each of said switch means comprising:

first and second transistors which are complementary to one another and which are interconnected to form a regenerative switch, each transistor having respective emitter, base and collector electrodes, a first terminal connected to the emitter electrode of the first transistor, a second terminal connected to both the base electrode of the first transistor and the collector electrode of the second transistor, a third terminal connected to the emitter electrode of the second transistor, and a fourth terminal connected to both the base electrode of the second transistor and the collector electrode of the first transistor;

first and second resistive means connecting the second terminal of the first switch means to, respectively, the first terminal and the second terminal of the second switch means;

third and fourth resistive means connecting the said first voltage supply line to, respectively, the third terminal of the first switch means and the third terminal of the second switch means;

first means coupling the third terminal of the first switch means to the fourth terminal of the third switch means;

second means coupling the second terminal of the second switch means to the third terminal of the third switch means;

third means coupling the first terminal of the first switch means to the said third voltage supply line; and fourth means coupling the first terminal of the third switch means to the said second voltage supply line; the first switch means thereby being responsive to the application of a first of two successive input signals to the first terminal of the second switch means to switch the first switch means from its first to its second operative state, the second switch means being responsive to the cessation of the first signal to switch from its first to its second operative state, the third switch means being responsive to the application of the second input signal to switch from its first to its second operative state and thereupon to initiate switching of the first and second switch means back to their first operative states, and the third switch means being operative to switch back to its first operative state in response to the cessation of said second signal.

4. A divide-by-two circuit according to claim 3 wherein each said switch means is a semiconductor device in which two interconnected transistors of opposite conductivity-type to one another each comprise first, second and third regions formed in a single semiconductor body, the first region of a first of the two transistors being of one conductivity-type material, the second region of the said first transistor being of the opposite conductivity-type material, both said first and second regions embracing a third region of said first transistor, the said first region of said first transistor being an extension from a first region of said one conductivity-type material in a second of the two transistors, and the said second region of said first transistor being an extension from a second region of said opposite conductivity-type material in said second transistor.

5. A divide-by-two circuit comprising first and second voltage supply lines to be connected to an electric supply;

a third voltage supply line which is to have applied thereto a voltage intermediate the voltages on said first and second voltage supply lines;

first, second and third switch means, each said switch means having first and second operative states, each switch means comprising first and second terminals between which there is an electric circuit path and a control terminal to which a signal is to be applied to switch said switch means from its first to its second operative state by initiating a change in current flow through the said path, the third switch means including coupling means to cause said third switch means to switch as aforesaid only in response to a change in signal amplitude in a predetermined sense, and the first and second switch means each including coupling means to cause those switch means to switch as aforesaid only in response to a change in signal amplitude in a sense opposite to said predetermined sense;

first and second resistive means connecting the control terminal of the first switch means to, respectively, the control terminal and first terminal of the second switch means;

third and fourth resistive means connecting the said first voltage supply line to, respectively, the second terminal of the first switch means and the second terminal of the second switch means;

first means connecting the second terminal of the first switch means to the control terminal of the third switch means;

second means connecting the control terminal of the second switch means to the second terminal of the third switch means;

third means connecting the first terminal of the first switch means to the said third voltage supply line; and fourth means connecting the first terminal of the third switch means to the second voltage supply line; whereby to enable the first switch means to respond to the application to the first terminal of the second switch means of a first of two successive input signals to switch from its first to its second operative state, the second switch means to respond to the cessation of said first signal to switch from its first to its second operative state, the third switch means to respond to the application of the second input signal to switch from its first to its second operative state and thereupon to initiate switching of the first and second switch means back to their first operative states, and the third switch means to switch back to its first operative state in response to the cessation of said second signal.

6. A divide-by-two circuit according to claim 5, wherein the first and second operative states of each switch means correspond respectively to nonconducting and conducting states of the electric current path in that switch means.

7. A divide-by-two circuit according to claim 5 wherein each said switch means includes a first transistor of one conductivity-type and a second transistor of the opposite conductivity-type interconnected to form a regenerative switch.

8. A divide-by-two circuit according to claim 7 wherein the coupling means in the third switch means couples the control terminal to a base electrode of the second transistor, and the coupling means in each of the first and second switch means couples the control terminal to a base electrode of the first transistor.

9. A divide-by-two circuit according to claim 5 wherein the said first and second resistive means have substantially equal values of resistance.

10. A divide-by-two circuit comprising an input terminal;

first, second and third electric switches each having first and second operative states;

first means coupling the said first switch to the said input terminal to cause that switch to change from its first to its second operative state in response to the application of a first signal to the said input terminal;

second means coupling the said second switch to the said input terminal and to the said first switch to cause the said second switch to change from its first to its second operative state in response to the cessation of said first signal; and third means coupling the said third switch to the said input terminal and to the said first and second switches to cause the said third switch to change from its first to its second operative state in response to the application of a second signal to the said input terminal; said third coupling means including means to cause the said first and second switches to revert to their said first operative states in response to the change of said third switch to its second operative state, and means to cause said third switch to revert to its first operative state in response to the cessation of said second signal.

* * * * *